Sept. 22, 1970

P. J. BURKE, JR 3,530,229

TRANSMISSION LINE CABLE OR THE LIKE AND TERMINAL CONNECTION THEREFOR

Filed Sept. 3, 1968

*INVENTOR*

PETER J. BURKE, JR.

BY John S. Gasper

*ATTORNEY*

United States Patent Office 3,530,229
Patented Sept. 22, 1970

3,530,229
TRANSMISSION LINE CABLE OR THE LIKE AND TERMINAL CONNECTION THEREFOR
Peter J. Burke, Jr., Tioga Center, N.Y., assignor to International Business Machines Corporation, Armonk, N.Y., a corporation of New York
Filed Sept. 3, 1968, Ser. No. 756,782
Int. Cl. H05k 1/04
U.S. Cl. 174—68.5 3 Claims

ABSTRACT OF THE DISCLOSURE

A multiple conductor transmission line cable comprises plural conductor lines and a ground plane on opposite sides of a flexible dielectric layer. Terminal pins are electrically connected to the conductor lines and ground plane by a soldered joint to terminal lands and pads formed on opposite surfaces of the dielectric layer. In the ground plane, the terminal pin is soldered to a land portion formed in the ground plane which is connected by bridge sections connected to the main position of the ground plane. The bridge sections present thermal restriction to heat dissipation due to heat sink characteristics of the ground plane.

BACKGROUND OF THE INVENTION

Field of the invention

The present invention relates to flat transmission line cables, or the like, and more particularly to a terminal connection therefor.

Description of the prior art

Transmission line cables of the type related to this invention comprise plural layers of conductor and dielectric materials laminated together in interspersed relationships. Such devices are commonly used as interconnection means between various circuit elements and circuit assemblies commonly applied in data processing and other electronics equipments which employ miniaturized packaging. In such cables, and the like, certain of the metal layers have plural individual conductor lines while other layers may serve as shield or voltage planes. Electrical connection to the conductive layers, lines and planes, is effected using a soldered joint whereby the pins are mechanically joined directly to the conductor layers or through a plated via hole connection.

The formation of the solder joint has presented problems caused by insufficient heat which results in defective mechanical bonding of the terminal pin to the conductive layer material. This has been particularly true where the attachment is made to the voltage plane because of the heat sink properties of such a layer. Attempted solutions to the problem have been to eliminate the solder connection entirely or to apply additional heating. The nonsoldered connection has required relatively complex structures for miniaturized application and, while satisfactory for some applications, is not as rugged as a soldered bond. The application of additional heat is not always possible in miniaturized structures and often produces adverse effects on the dielectric, the bond between layers of the cable, or adjacent terminal connections.

SUMMARY OF THE INVENTION

The object of the present invention is to provide a cable, or the like, having an improved terminal structure which overcomes the above problems for soldered-bonding of a terminal element to the conductive layers of the cable.

It is a further object to provide a cable, or the like, having an improved terminal structure which provides a reliable and effective soldered connection of terminal elements to conductive layers having high heat sink properties.

It is a further object to provide an improved cable structure, or the like, with improved terminal construction which is relatively simple, is useful in miniaturized circuit structures, and which is readily adapted for manufacture in accordance with high rate production techniques.

The above, as well as other objects, are realized in accordance with the practice of this invention by providing the conductive layer of the cable, or the like, with a terminal structure such that heat losses do not occur when the terminal pin element is being soldered to the conductor layer. In the preferred form, this is obtained by providing the conductor layer with a thermal restriction between a terminal land and the main portion of the conductive layer. A terminal pin is connected by a solder joint to the terminal land only. In the preferred form, the terminal land has a plated via hole connection and the terminal pin element is solder-bonded to it. In any case, the terminal land and plated via hole connection are connected through a thermal constriction to the conductive layer. By this means, heat losses which prevent a good solder bond or which require excessive heating likely to damage the cable can be controlled. Thus, relatively low heating can be used to produce good solder bonds without damage to the cable and manufacturing can be produced relatively rapidly.

The foregoing and other objects, features and advantages of the invention will be apparent from the following more particular description of preferred embodiments of the invention, as illustrated in the accompanying drawings.

DESCRIPTION OF THE PREFERRED EMBODIMENT

Figure 2:
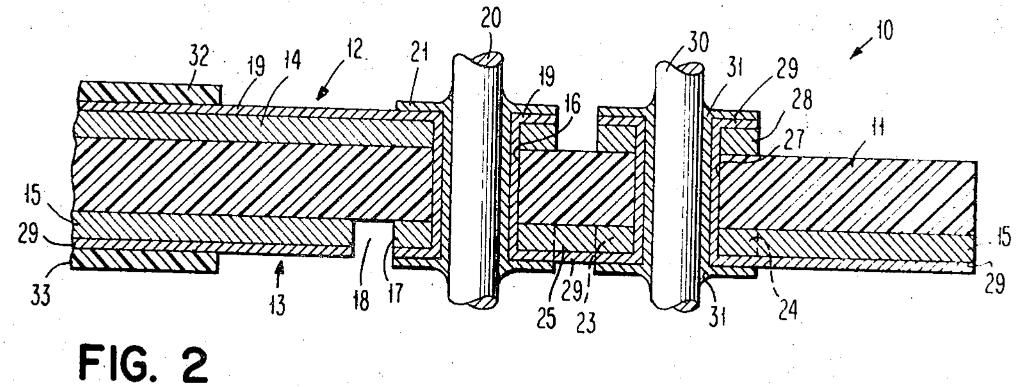
FIG. 2 is a section of the cable of FIG. 1 taken along line 2—2.
Figure 1:
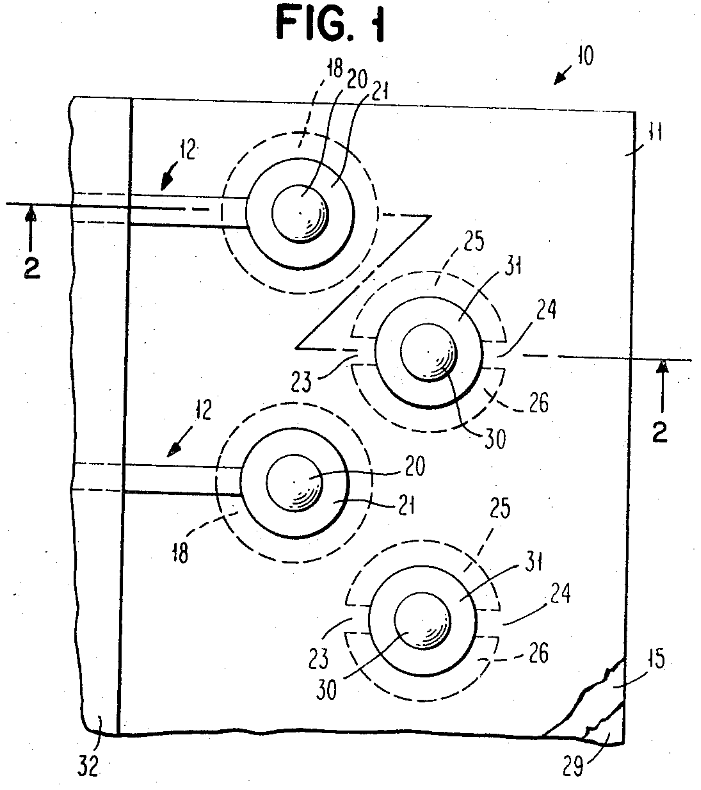
FIG. 1 is a top plan view of the end of a portion of a flat transmission line cable showing the terminal pin elements soldered to various conductive elements of the cable.
Figure 4:
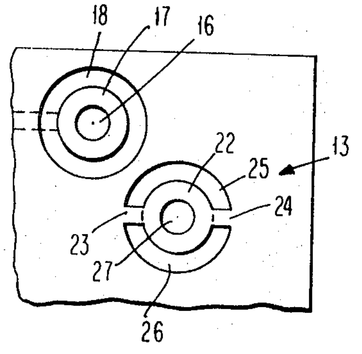
FIG. 4 is a fragmentary portion of the cable of FIG. 1 with the terminal pin removed to illustrate structure of the conductive layer for thermally controlling heat flow during soldering operations.
Figure 3:
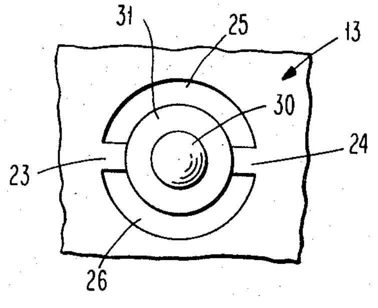
FIG. 3 is a bottom view of a single terminal of the cable of FIGS. 1 and 2 illustrating the unique details of terminal structure of the present invention.

Referring to FIGS. 1 and 2, the transmission line cable 10 comprises a dielectric layer 11 having plural individual conductor strips 12 on the upper surface and a ground plane 13 on the bottom surface thereof. The conductor strips 12 and the ground plane 13 each comprises base metal layers 14 and 15 respectively bonded by an adhesive (not shown) to their respective surfaces of dielectric layer 11. For terminal connection purposes, the base layer 14 of conductors 12 is formed with a circular terminal pad having a central opening which coincides with a through hole 16 in dielectric layer 11. A circular terminal pad 17 on the bottom surface of dielectric layer 11 formed from base layer 15 of ground plane 13 has a central opening also coinciding with via hole 16 in dielectric layer 11. As seen in FIG. 4, the terminal pad 17 of base layer 15 is electrically isolated from the ground plane 13 by a circular groove 18. Electrical interconnection of the terminal land of base layer 14 of conductors 12 and the terminal pad 17 of base layer 15 is formed by a continuous metallic layer 19 which is plated over the entire base layer 14 of conductors 12, the via hole 16 and terminal pad 17 of base layer 15. A terminal pin for effecting electrical connection from an external circuit to conductors 12 is provided by a terminal pin 20 bonded by solder coat 21 which overlays the interconnection layer 19 in the via hole 16 and on the circular land of conductor 12 and terminal pad 17.

For terminal connections to ground plane 13, base layer 15 on the bottom surface of dielectric layer 11 has a terminal land 22 connected to the main portion of ground plane 13 by reduced bridge connections 23 and 24. The bridge connections 23 and 24 are formed by curved grooves 25 and 26 in the base layer 15. Terminal land 22 has a central opening aligned with via hole 27 in dielectric layer 11. A circular terminal pad 28, similar to terminal pad 17, formed from base layer 14 on the upper surface of dielectric layer 11 has a central opening in alignment with via hole 27. Electrical interconnection of terminal land 22 and terminal pad 28 is provided by continuous metal layer 29 which is plated over the entire surface of base layer 15 on dielectric layer 11, including land terminal 22 and bridge connections 23 and 24, the interior surface of via hole 27, and terminal pad 28. External connection to ground plane 13 is provided by a terminal pin 30 bonded by solder fillet 31 which overlays the interconnection layer 29 on terminal pad 22, in via hole 27, and on the land portion 22 of ground plane 13. In making this connection, solder fillet 31 does not overlay the bridge portions 25 and 26. Electrical connection of terminal pin 30 to ground plane 13 is therefore made exclusively through bridge portions 25 and 26. Superposed on conductors 12 and ground plane 13 are dielectric layers 32 and 33. These layers are applied over the cable 10 between terminal sections as insulation and mechanical support, as desired.

While various materials may be used in practicing the present invention, in a preferred embodiment, the dielectric material 11 is a flexible polyimide material to which copper is bonded by a modified epoxy adhesive to opposite sides thereof. Such basic materials are commercially available. The plated layers 19 and 29 are preferably deposited electrolessly from acid copper solutions. In addition to serving as the electrical interconnection, the plated layers prevent corrosion of the copper base layers 14 and 15 and the various terminal lands, pads, and the bridge sections 23 and 24.

A preferred method for making cable 10 comprises drilling a series of holes followed by etching all the conduction patterns of conductors 12 and all terminal pads and lands in a single operation. Starting with cable stock which is a dielectric layer having a copper layer bonded to opposite surfaces thereof, a series of terminal via holes are drilled in one or more rows near the end of the cable. A photoresist, such as KPR, or the like, is then applied to the copper layers, preferably taking care not to allow photoresist to fill any of the holes. After proper alignment of the holes a photoimage of the conductor patterns, with land terminals and terminal pads, are projected simultaneously to both sides of the cable 10. The exposed photoresist is then removed after which it is placed in a copper etchant solution. One such solution is ferric choloride. Following completion of copper etching to form the conductors 12, terminal pads 17 and 27, land terminals and terminal lands 22 with bridge portions 23 and 24, the cable 10 is then washed in water and dried. Prior to plating layers 19 and 29, the via holes are treated with an alkaline cleaning solution to improve the adherence of metal plating of the via holes. Following washing of the adhesive etchant solution, the cable is placed in an electroless solution of acid copper for the deposition of interconnection layers 19 and 29. The next step is to wash and dry the cable 10, applying adhesive bonding agents over sheets of dielectric layers 32 and 33 and/or the cable 10, and pressure laminate the sheets 32 and 33 on cable 10 and cutting to proper size to leave the terminal ends exposed. Terminal pins 20 and 30 are then soldered in place either individually or in groups in accordance with usual techniques after application of cleaning agents to the terminal areas and use of solder fluxes in the terminals and via holes.

Because of the unique function of the bridge portions 23 and 24, which function as a thermal restriction, the heat applied to terminal pins 30 is substantially equal to that applied to pins 20. In both cases, the applied heat is great enough to obtain a good solder joint over the terminal lands and pads and within the plated via holes but need not be so great as to damage the dielectric properties of layer 11 nor cause de-soldering of other pins in the immediate vicinity. Thus, since pins 20 and 30 are solderable at substantially the same applied heat, more rapid manufacture can be achieved.

While the present invention, in its preferred embodiment, is illustrated in making flexible cables using polyimides and copper, the invention may be practiced with other materials used as dielectrics and conductor materials. Similarly, the invention may be employed with layers exceeding the number shown and would be particularly applicable with multilayer interconnection boards where the interior layers are connected by via hole plating. Such a configuration would have cumulative heat sink properties, making the use of thermal restrictions in the plated hole areas desirable to the amount of heat required in soldering terminal pins in place in the via holes. While the invention is shown as practiced with ground planes, conductive layers with high heat sink properties may take other forms in an electrical cable structure.

While the invention has been particularly shown and described with reference to a preferred embodiment thereof, it will be understood by those skilled in the art that various changes in form and details may be made therein without departing from the spirit and scope of the invention.

I claim:

1. A multilayer electric cable device, or the like, comprising
 - one or more conductor layers at least one of which is a sheetlike layer having heat sink properties and at least one layer of dielectric material,
 - said conductor layers being surface bonded to said dielectric material by a bonding material,
 - terminal means for said sheetlike layer designed to prevent heat damage to said bonding material and/or said dielectric material during soldering of a terminal pin or the like to said sheetlike layer comprising
   - a terminal land formed in said sheetlike layer such that said terminal land is substantially surrounded by said sheetlike layer, said terminal land being electrically connected solely by bridge element means to the surrounding sheetlike layer, said bridge element means forming a heat flow restriction from said terminal land to said surrounding sheetlike layer whereby heat applied to said terminal land for soldering a pin or the like thereto is maintainable at a level below the level which causes damage to said bonding material and/or said dielectric.

2. In a multilayer cable device, or the like, in accordance with claim 1 in which said dielectric material is polyimide and conductor layers are copper.

3. A cable device in accordance with claim 1 in which said terminal land, said bridge element means and sheetlike layer are integrally connected.

References Cited

UNITED STATES PATENTS 2,699,424 1/1955 Nieter.

OTHER REFERENCES

Van Dam, Netherlands printed application No. 289,945, pub. June 6, 1965.

DARRELL L. CLAY, Primary Examiner

U.S. Cl. X.R.

29—626; 317—101; 339—17